US011605544B2

(12) United States Patent
Chu et al.

(10) Patent No.: US 11,605,544 B2
(45) Date of Patent: Mar. 14, 2023

(54) METHODS AND SYSTEMS FOR CLEANING HIGH ASPECT RATIO STRUCTURES

(71) Applicant: Applied Materials, Inc., Santa Clara, CA (US)

(72) Inventors: Schubert S. Chu, San Francisco, CA (US); Errol Antonio C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 59 days.

(21) Appl. No.: 17/025,669

(22) Filed: Sep. 18, 2020

(65) Prior Publication Data

US 2022/0093418 A1 Mar. 24, 2022

(51) Int. Cl.
*H01L 21/67* (2006.01)
*H01L 21/02* (2006.01)

(52) U.S. Cl.
CPC .. *H01L 21/67028* (2013.01); *H01L 21/02049* (2013.01)

(58) Field of Classification Search
CPC ......... H01L 21/67028; H01L 21/02043; H01L 21/02049; H01L 21/02046; H01L 21/02057; H01L 21/0206; H01L 21/67069; H01L 21/67103; H01L 21/67109; H01L 21/68742

(Continued)

(56) References Cited

U.S. PATENT DOCUMENTS 7,695,765 B1 * 4/2010 Fox ............... H01L 21/02211
427/249.1
7,922,824 B2 4/2011 Minsek et al.
(Continued)

FOREIGN PATENT DOCUMENTS

CN 105575751 A 5/2016
JP 2007537582 A 12/2007
(Continued)

OTHER PUBLICATIONS

International Search Report and Written Opinion dated Dec. 6, 2021 for Application No. PCT/US2021/045648.

(Continued)

*Primary Examiner* — Lan Vinh
(74) *Attorney, Agent, or Firm* — Patterson + Sheridan, LLP (57) ABSTRACT

Embodiments of the present disclosure generally relate to methods and systems for cleaning a surface of a substrate. In an embodiment, a method of processing a substrate is provided. The method includes introducing a substrate to a processing volume of a processing chamber by positioning the substrate on a substrate support. The method further includes flowing a first process gas into the processing volume, the first process gas comprising HF, flowing a second process gas into the processing volume, the second process gas comprising pyridine, pyrrole, aniline, or a combination thereof, and exposing the substrate to the first process gas and the second process gas to remove oxide from the substrate under oxide removal conditions. In another embodiment, a system is provided that includes a processing chamber to process a substrate, and a controller to cause a processing method to be performed in the processing chamber.

20 Claims, 3 Drawing Sheets

(58) Field of Classification Search
USPC .......................... 438/694, 706, 715; 216/58
See application file for complete search history.

(56) References Cited

U.S. PATENT DOCUMENTS

| | | | |
|---|---|---|---|
| 7,960,328 | B2 | 6/2011 | Visintin et al. |
| 8,084,367 | B2 | 12/2011 | Lee et al. |
| 8,585,917 | B2 | 11/2013 | Lee et al. |
| 8,642,526 | B2 | 2/2014 | Visintin et al. |
| 8,765,654 | B2 | 7/2014 | Minsek et al. |
| 8,790,470 | B2 | 7/2014 | Lee et al. |
| 9,063,431 | B2 | 6/2015 | Barnes et al. |
| 9,443,713 | B2 | 9/2016 | Minsek et al. |
| 2003/0017628 | A1 | 1/2003 | Li et al. |
| 2007/0020890 | A1 | 1/2007 | Thakur et al. |
| 2007/0113868 | A1 | 5/2007 | Fu et al. |
| 2007/0181057 | A1 | 8/2007 | Lam et al. |
| 2007/0286956 | A1 | 12/2007 | Samoilov |
| 2007/0293054 | A1 | 12/2007 | Lee et al. |
| 2008/0118663 | A1 | 5/2008 | Choi et al. |
| 2008/0202425 | A1 | 8/2008 | Gelatos et al. |
| 2008/0230846 | A1 | 9/2008 | Obeng et al. |
| 2008/0261847 | A1 | 10/2008 | Visintin et al. |
| 2009/0017227 | A1 | 1/2009 | Fu et al. |
| 2009/0215658 | A1 | 8/2009 | Minsek et al. |
| 2009/0253268 | A1* | 10/2009 | Yellowaga ........ H01L 21/02063 252/79.1 |
| 2009/0294060 | A1 | 12/2009 | Kobayashi et al. |
| 2010/0317198 | A1 | 12/2010 | Antonelli et al. |
| 2011/0061810 | A1 | 3/2011 | Ganguly et al. |
| 2011/0186086 | A1 | 8/2011 | Minsek et al. |
| 2011/0275164 | A1 | 11/2011 | Visintin et al. |
| 2012/0034761 | A1 | 2/2012 | Kuppurao et al. |
| 2012/0080059 | A1 | 4/2012 | Lee et al. |
| 2012/0085495 | A1 | 4/2012 | Lee et al. |
| 2013/0296214 | A1 | 11/2013 | Barnes et al. |
| 2014/0011339 | A1 | 1/2014 | Zheng et al. |
| 2014/0227881 | A1 | 8/2014 | Lubomirsky et al. |
| 2015/0000697 | A1 | 1/2015 | Minsek et al. |
| 2015/0040822 | A1 | 2/2015 | Olsen et al. |
| 2015/0056814 | A1 | 2/2015 | Ling et al. |
| 2015/0307818 | A1 | 10/2015 | Barnes et al. |
| 2016/0138161 | A1 | 5/2016 | Chen et al. |
| 2016/0312360 | A1 | 10/2016 | Rasheed et al. |
| 2019/0085459 | A1* | 3/2019 | Sone ....................... C23C 16/56 |

FOREIGN PATENT DOCUMENTS

| | | |
|---|---|---|
| JP | 2008-28140 A | 2/2008 |
| KR | 20080064147 A | 7/2008 |
| KR | 20110019445 A | 2/2011 |
| KR | 20150013637 A | 2/2015 |
| KR | 20160042010 A | 4/2016 |
| TW | 201523694 A | 6/2015 |
| TW | 201712727 A | 4/2017 |
| TW | 201721712 A | 6/2017 |
| WO | 2008/005832 A2 | 1/2008 |

OTHER PUBLICATIONS

International Search Report and Written Opinion for Application No. PCT/US2018/048588 dated Dec. 14, 2018.
Taiwan Office Action dated Apr. 17, 2019 for Application No. 107130332.
International Search Report and Written Opinion dated Dec. 4, 2018 for Application No. PCT/US2018/046501.
International Search Report dated Aug. 13, 2018 for Application No. PCT/US2018/046497.
Bae et al., "Improved etching method for microelectronic devices with supercritical carbon dioxide", Microelectronic Engineering 86 (2009) 128-131.
Guertin et al., "Coordination of silicon tetrafluoride with pyridine and other nitrogen electron-pair donor molecules", Canadian Jour. Of Chem., vol. 47, 1969, 6 pages.
Japanese Office Action dated Apr. 1, 2021, for Japanese Patent Application No. 2020-512543.
Korean Office Action dated May 5, 2021, for Korean Patent Application No. 10-2020-7008636.
Korean Notice of Allowance dated Jul. 6, 2021, for Korean Patent Application No. 10-2020-7008636.
Taiwan Patent Application No. 107128243, Office Action and Search Report dated Apr. 29, 2022, 10 pages.
Notice of Reasons for Refusal (Translated) in related application TW 2020-512399 dated Mar. 18, 2021.
Korean Office Action in related application KR 10-2020-7008638 dated May 5, 2021.
Japanese Office Action in related application JP 2020-512399 dated Mar. 18, 2021.

* cited by examiner

METHODS AND SYSTEMS FOR CLEANING HIGH ASPECT RATIO STRUCTURES

BACKGROUND

Field

Embodiments of the present disclosure generally relate to methods and systems for cleaning a surface of a substrate.

Description of the Related Art

Surfaces of monocrystalline silicon and epitaxial silicon are susceptible to contamination when exposed to typical substrate fabrication facility ambient conditions. For example, a native oxide layer may form on the monocrystalline silicon surface prior to deposition of the epitaxial layer due to handling of the substrates and/or exposure to the ambient environment in the substrate processing facility. Additionally, foreign contaminants such as carbon and oxygen species present in the ambient environment may deposit on the monocrystalline surface. The presence of a native oxide layer and/or contaminants on the monocrystalline silicon surface negatively affects the quality of epitaxial layer(s) subsequently formed on the monocrystalline surface. It is therefore desirable to pre-clean the substrates in order to remove the surface oxidation and other contaminants before epitaxial layers are grown on the substrates.

The removal of native oxide on silicon surfaces at the bottom of high aspect ratio device features can be challenging for at least the reason that the reactants have to reach the bottom of the feature in order to clean the feature. That is, oxide removal becomes more difficult as the aspect ratio of the feature increases and the opening becomes smaller. In addition, the achievable depth of oxide removal is limited by, e.g., bottling, where the bottom of the trench pinches off and aspect ratio-dependent oxide removal reduces significantly as the aspect ratio or depth increases. For example, conventional dry clean processes using, e.g., HF/NH$_3$ or NF$_3$/NH$_3$, form salts in the features during the cleaning process. Such salts pinch off the bottom of the trench, thereby limiting the ability of reactants to reach the bottom of high aspect ratio features. In order to mitigate salt pinch-off in the tighter openings of high aspect ratio features, conventional methods include an anneal operation to remove the salt—that is, conventional methods utilize multiple cycles of salt formation and anneal, leading to low fabrication throughput.

There is a need for new and improved methods of cleaning a surface of a substrate that overcome one or more of the aforementioned deficiencies.

SUMMARY

Embodiments of the present disclosure generally relate to methods and systems for cleaning a surface of a substrate.

In an embodiment, a method of processing a substrate is provided. The method includes introducing a substrate to a processing volume of a processing chamber by positioning the substrate on a substrate support. The method further includes flowing a first process gas into the processing volume, the first process gas comprising HF, flowing a second process gas into the processing volume, the second process gas comprising pyridine, pyrrole, aniline, or a combination thereof, and exposing the substrate to the first process gas and the second process gas to remove oxide from the substrate under oxide removal conditions.

In another embodiment, a method of processing a substrate is provided. The method includes introducing a substrate to a processing volume of a processing chamber by positioning the substrate on a substrate support. The method further includes flowing a first process gas into the processing volume, the first process gas comprising HF, flowing a second process gas into the processing volume, the second process gas comprising pyridine, pyrrole, aniline, or a combination thereof, and exposing the substrate to the first process gas and the second process gas to remove oxide from the substrate under oxide removal conditions. The oxide removal conditions include maintaining the substrate support at a temperature from about −10° C. to about 80° C., maintaining the processing volume at a pressure of about 600 Torr or less, or a combination thereof.

In another embodiment, a system is provided. The system includes a processing chamber to process a substrate, and a controller to cause a processing method to be performed in the processing chamber. The processing method includes introducing a substrate to a processing volume of a processing chamber by positioning the substrate on a substrate support, flowing a first process gas into the processing volume, the first process gas comprising HF, flowing a second process gas into the processing volume, the second process gas comprising pyridine, pyrrole, aniline, or a combination thereof, and exposing the substrate to the first process gas and the second process gas to remove oxide from the substrate under oxide removal conditions.

In another embodiment, a system is provided. The system includes a processing chamber to process a substrate, and a controller to cause a processing method to be performed in the processing chamber. The processing method includes introducing a substrate to a processing volume of a processing chamber by positioning the substrate on a substrate support, flowing a first process gas into the processing volume, the first process gas comprising HF, flowing a second process gas into the processing volume, the second process gas comprising pyridine, pyrrole, aniline, or a combination thereof, and exposing the substrate to the first process gas and the second process gas to remove oxide from the substrate under oxide removal conditions. The oxide removal conditions include maintaining the substrate at a temperature from about −10° C. to about 80° C., maintaining the processing volume at a pressure of about 600 Torr or less, or a combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and systems for cleaning a surface of a substrate. The inventors have found new and improved methods of removing oxide(s), such as native oxide(s), with, e.g., high conformality and high selectivity versus other dielectric materials. Briefly, and in some examples, the methods described herein utilize hydrogen fluoride (HF) and a nitrogen-containing species, such as weakly basic amines, such as pyridine, pyrrole, aniline, or a combination thereof, to remove undesired oxide on one or more surfaces of high aspect ratio device features.

Conventional cleaning processes are limited by salt formation that pinches off the bottom of trenches, prohibiting reactants from reaching oxide at the bottom of trenches. The formed salts are then sublimed by an anneal operation. As an example, one typical cleaning process utilizes HF and $NH_3$, which at low temperatures (e.g., less than 20° C.), forms a $(NH_4)_2SiF_6$ salt hydrate. The salt hydrate is then sublimed at temperatures greater than 100° C. The result is low fabrication throughput due to the multi-cycle process of <20° C. salt formation and >100° C. annealing. In addition, conventional methods may not demonstrate optimal selectivity. The surfaces to be cleaned are adjacent to dielectrics, such as spacers and hardmasks, which should not be damaged or etched by the cleaning process. Although conventional cleaning processes remove oxide, dielectrics such as SiN and/or SiON sidewall spacers or other features may also be undesirably etched.

In contrast to conventional processes, the methods described herein are, e.g., salt-free, highly selective, highly conformal, and useful for cleaning high aspect ratio features. Further, the methods described herein enable high-throughput cleaning of high aspect ratio features with minimal loss of dielectric materials, e.g., SiN or SiON sidewall spacers and hardmasks. In addition, the methods described herein enable isotropic and conformal cleaning of features whereby native oxide on, e.g., the sidewall (110) silicon surfaces, are removed in addition to the native oxide on (100) silicon surfaces. After cleaning, the resultant substrate can be used for further processing such as epitaxial growth and/or chemical vapor deposition of Si- and/or Ge-containing layers.

In cases where complexes, e.g., $(C_5H_5N)_2SiF_4$, if any, are formed during operation of methods described herein, a low-temperature anneal can be used to remove the complexes. Such an anneal can be performed at lower temperatures than conventional processes as the $(C_5H_5N)_2SiF_4$ complex that may form during processing sublimes at lower temperatures than salts, e.g., $(NH_4)_2SiF_6$, formed by conventional processes. In addition, although a $(C_5H_5NH)_2SiF_6$ salt may form during operation of the methods described herein, such a salt forms much slower than the $(C_5H_5N)_2SiF_4$ complex. That is, complex formation dominates salt formation. In cases where salt, e.g., $(C_5H_5NH)_2SiF_6$, is formed, the salt can be removed at temperatures greater than or equal to about 165° C.

In some examples, a nitrogen-containing species, such as pyridine (or anhydrous pyridine), is used in conjunction with HF (or anhydrous HF) for isotropic dry etching of $SiO_2$ under vacuum. Through $(C_5H_5NH)^+$ and $HF_2^-$ species, pyridine can catalyze the HF conversion of $SiO_2$ to $SiF_4$+ $H_2O$ and/or form a $(C_5H_5N)_2SiF_4$ complex which has <80° C. sublimation temperature. Unlike known method options using water, alcohol, or $NH_3$ to achieve high HF etch selectivity versus other dielectrics, the methods described herein avoid wet HF corrosion, carbon contamination, and the slow >100° C. fluorosilicate salt-anneal cycles. The inventors observe faster throughput relative to conventional methods even if a multi-cycle complex formation and anneal is utilized. The methods described herein avoid, or at least mitigate, production of the high melting temperature salt, $(C_5H_5NH)_2SiF_6$, via formation of the $(C_5H_5N)_2SiF_4$ complex instead, or via routes that would otherwise use water or alcohol catalysts, thereby minimizing HF corrosion and carbon contamination, all while avoiding selectivity reductions and the salt pinch-off problems during native oxide clean at the bottom of high aspect ratio structures.

Figure 1A:
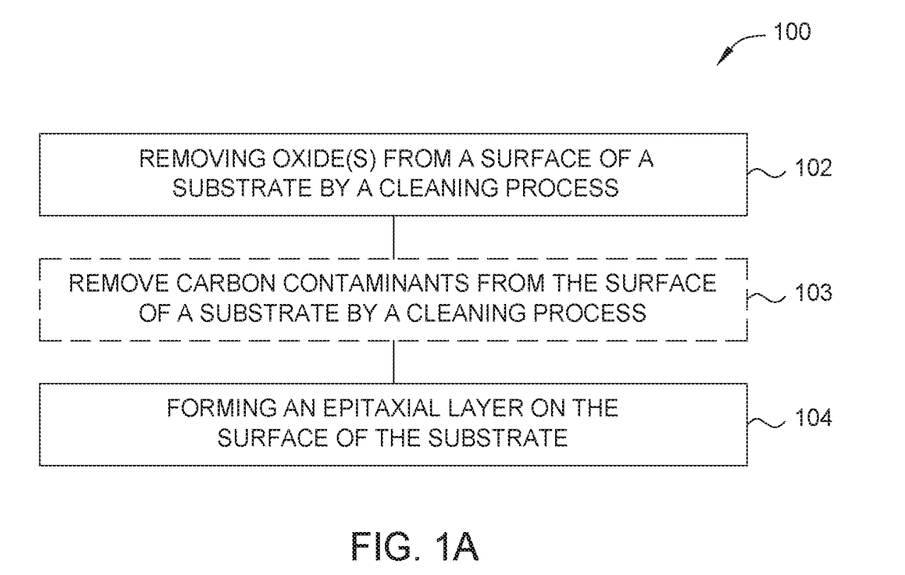
FIG. 1A is a flowchart of an example processing sequence 100 according to at least one embodiment of the present disclosure.

FIG. 1A is a flowchart of an example processing sequence 100 according to at least one embodiment of the present disclosure. In box 102, oxide(s) is removed from a surface of a semiconductor substrate using a cleaning process. The substrate may include a silicon containing material and the surface may include a material, such as silicon (Si), germanium (Ge) or silicon germanium alloys (SiGe). In some implementations, the Si, Ge, or SiGe surface may have an oxide layer, such as a native oxide layer, and contaminants disposed thereon. Due to the sensitivity of epitaxial deposition processes to oxide and contaminants, such as carbon containing contaminants, surface contamination resulting from exposure to typical cleanroom environments for a few hours can become significant enough for the accumulated oxide and contaminants to affect the quality of a subsequently formed epitaxial layer.

The substrate surface may be cleaned by performing an oxide removal process and a contaminant removal process. In one implementation, the oxide(s) are removed from the surface of the substrate using a cleaning process (box 102), and the contaminants, such as carbon containing contaminants (box 103), are removed from the surface of the substrate using a reducing process, for example. An example processing chamber that can be adapted to perform the cleaning processes described herein includes the Clarion™ chamber, which is available from Applied Materials, Inc., of Santa Clara, Calif. Chambers from other manufacturers may also be used.

In optional box 103, a second cleaning process may be performed by removing carbon contaminants from the surface of the substrate. The cleaning process to remove carbon contaminants (box 103) may be performed prior to or after oxide removal (box 102). Operations associated with box 103 can be performed in the same processing chamber or a different processing chamber as those operations associated with box 102. Following the operations of box 102 and box 103 is provided a substrate surface that is uniformly oxide and contaminant free which improves the quality of layers subsequently formed on the surface of the substrate.

In box 104, an epitaxial layer is formed on the surface of the substrate. An exemplary epitaxial process may be a selective epitaxial process performed at a temperature that is less than about 800° C., for example about 450° C. to about 650° C. The epitaxial layer may be formed using a high temperature chemical vapor deposition (CVD) process. The epitaxial layer may be a crystalline silicon, germanium, or silicon germanium, or any suitable semiconductor material such as a Group III-V compound or a Group II-VI compound. In one exemplary thermal CVD process, processing gases such as chlorosilanes $SiH_xCl_{4-x}$ (mono, di, tri, tetra), silanes $Si_xH_{2x+2}$ (silane, disilane, trisilane, etc.), germanes $Ge_xH_{2x+2}$ (germane, digermane, etc.), hydrogen chloride HCl, chlorine gas $Cl_2$, or combinations thereof are used to form the epitaxial layer. The processing temperature is about 800° C. or lower, such as from about 300° C. to about 600° C., for example about 450° C., and the processing pressure is from about 5 Torr to about 600 Torr. In at least one embodiment, the processing chamber used to perform operations of box 104 may be a film formation chamber, such as a vapor phase epitaxy deposition chamber, for example an Epi chamber available from Applied Materials, Santa Clara, Calif., that is capable of forming a crystalline silicon or silicon germanium. In other embodiments, the processing chamber used to perform operations of box 104 may be an epitaxy deposition chamber such as a single-substrate processing chamber. In other embodiments, the processing chamber may be a CVD or epitaxial deposition process chamber. An exemplary processing chamber that can be used to perform the epitaxial deposition process is the Centura™ Epi chamber, which is available from Applied Materials, Inc., of Santa Clara, Calif. Chambers from other manufacturers may also be used.

Figure 1B:
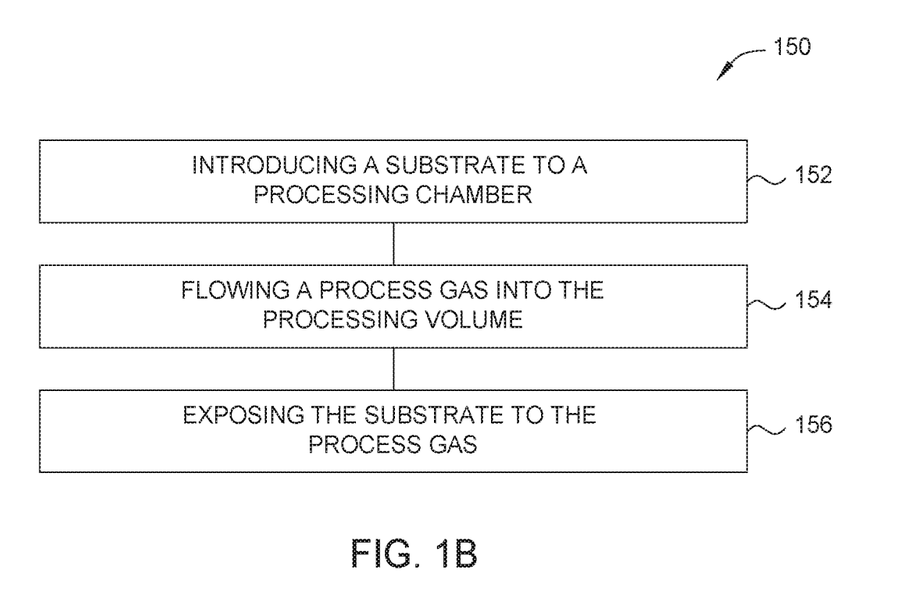
FIG. 1B is a flow chart of an example method of processing a substrate according to at least one embodiment of the present disclosure.

In a non-limiting example, the cleaning process of box 102 (an oxide removal process) can include those operations shown in the flowchart of process 150 of FIG. 1B. The process 150 includes introducing (e.g., transferring, conveying, etc.) the substrate to a processing region of a substrate processing chamber at operation 152. The substrate can be transferred into the processing chamber by any suitable means. The substrate may include a silicon containing material and the surface may include a material, such as silicon (Si), germanium (Ge) or silicon germanium alloys (SiGe). In some implementations, the Si, Ge, or SiGe surface may have an oxide layer, such as a native oxide layer, and contaminants disposed thereon.

The process 150 further includes flowing one or more process gases into the processing volume at operation 154. The process gas includes and/or is formed from HF and one or more of a nitrogen-containing species, such as weakly basic amines. The nitrogen-containing species can be formed from one or more nitrogen-containing compounds. Non-limiting examples of nitrogen-containing compounds include pyridine, pyrrole, aniline, or a combination thereof. Anhydrous HF and/or anhydrous nitrogen-containing species can be used.

In some embodiments, a first process gas comprising HF is flown into the processing volume through an inlet, and a second process gas comprising the nitrogen-containing species is flown through the same or different inlet. Additionally, or alternatively, a first process gas comprising a mixture of HF and a nitrogen-containing species are flown through a first inlet, and a second process gas comprising a nitrogen-containing species is flown through a second inlet. In these and other embodiments, the ratio of nitrogen-containing species to HF can be adjusted.

In some embodiments, the first process gas and the second process gas are co-flown into the processing volume. For example, a first processing gas comprising HF and a second processing gas comprising one or more nitrogen-containing species are co-flown into the processing volume. Additionally, or alternatively, the second process gas is intermittently flown into the processing volume while the first process gas is flown into the processing volume, or vice-versa.

Additionally, or alternatively, the first process gas comprising HF and the second process gas comprising one or more nitrogen-containing species can be sequentially flown into the processing volume. For example, the nitrogen-containing species is flown into the processing volume, then HF is flown into the processing volume, and then the nitrogen-containing species is again flown into the processing volume. As another example, HF is flown into the processing volume, then the nitrogen-containing species is flown into the processing volume, and then HF is again flown into the processing volume. As another example, HF and the nitrogen-containing species are co-flown into the processing volume, then the flow of the nitrogen-containing species is stopped, while HF is still flown into the processing volume. At a certain time period, flow of the nitrogen-containing species is resumed. As described below, one or more ampoules, one or more bubblers, and/or one or more liquid vaporizers may be used to provide HF, one or more nitrogen-containing species, or a combination thereof to the processing chamber.

The process 150 further includes exposing the substrate to the process gas at operation 156 under oxide removal conditions. The oxide removal process is highly conformal and highly selective for oxide layers, and thus does not readily etch silicon, germanium, or nitride layers regardless of whether the layers are amorphous, crystalline or polycrystalline. In some embodiments, the selectivity of the oxide removal process for oxide versus silicon or germanium is at least about 10:1, such as about 30:1, such as about 50:1 or better, such as about 100:1. In some embodiments, the oxide removal process can be also highly selective of oxide versus nitride. In a non-limiting example, the selectivity of the oxide removal process for oxide versus nitride is at least about 5:1, such as about 10:1 or better, such as about 20:1.

In some embodiments, either during or after the oxide removal process, an amount of thermal energy can be applied to the substrate to help remove any generated by-products, such as complexes and/or salts discussed above. In some embodiments, the thermal energy is provided via a radiant, convective, and/or conductive heat transfer process that causes the unwanted by-products found on the substrate surface to sublimate.

Various operations of the example processes described herein (e.g., box 102 or process 150) can include one or more process parameters as described below.

During oxide removal, a temperature of the substrate can be about 100° C. or less, such as from about −20° C. to about 90° C., such as from about −10° C. to about 80° C., such as from about 0° C. to about 60° C. In at least one embodiment and during oxide removal, the temperature of the substrate support ranges from $T_1$ to $T_2$ (in units of ° C.), where each of $T_1$ and $T_2$ is independently about −20, about −15, about −10, about −5, about 0, about 5, about 10, about 15, about 20, about 25, about 30, about 35, about 40, about 45, about 50, about 55, about 60, about 65, about 70, about 75, about 80, about 85, about 90, about 95, or about 100, as long as $T_1 < T_2$. Selectivity can be improved at lower temperatures, e.g., below about 20° C., while higher etch rates can be observed at higher temperatures.

Continuous supply of pyridine and higher flow ratios of pyridine to HF favors the formation of amine complexes, e.g., $(C_5H_5N)_2SiF_4$, during processing. The temperature of the substrate can be raised to about 50° C. or more, such as about 60° C. to about 80° C., to sublimate the complex partially or completely during/and or after exposing the substrate to the process gas. The temperature of the substrate can be cycled between that sublimation temperature and a more selective colder etch temperature. The temperature of the substrate can be modulated for example between the colder substrate support temperature and the hotter temperature of the processing chamber lid by positioning the substrate closer to the lid for sublimation and farther from the lid for the selective etch. If a salt, e.g., $(C_5H_5NH)_2SiF_6$, is formed during processing, a temperature of the substrate can be raised from about 120° C. to about 180° C., such as from about 150° C. to about 170° C., such as from about 155° C. to about 165° C. As described earlier, complex formation typically dominates salt formation, thereby avoiding or mitigating salt pinch-off and reducing the temperatures used for substrate cleaning relative to conventional processes.

A pressure within the processing volume can be about 600 Torr or less, such as about 300 Torr or less, such as about 100 Torr or less, such as about 10 Torr or less. In at least one embodiment, the pressure within the processing volume ranges from $P_1$ to $P_2$ (in units of Torr), where each of $P_1$ and $P_2$ is independently about 1, about 2, about 3, about 4, about 5, about 6, about 7, about 8, about 9, about 10, about 20, about 30, about 40, about 50, about 60, about 70, about 80, about 90, about 100, about 150, about 200, about 250, about 300, about 350, about 400, about 450, about 500, about 550, or about 600, as long as $P_1 < P_2$.

A flow rate of HF into the processing volume can be about 50 standard cubic centimeters per minute (sccm) or less for a 300 mm-sized substrate, such as from about 1 sccm to about 50 sccm, such as from about 2 sccm to about 20 sccm. In at least one embodiment, the flow rate of HF into the processing volume for a 300 mm-sized substrate ranges from flow rate$_1$ to flow rate$_2$ (in units of sccm), where each of flow rate$_1$ and flow rate$_2$ is independently about 1, about 2, about 3, about 4, about 5, about 6, about 7, about 8, about 9, about 10, about 11, about 12, about 13, about 14, about 15, about 16, about 17, about 18, about 19, about 20, about 21, about 22, about 23, about 24, about 25, about 26, about 27, about 28, about 29, about 30, about 31, about 32, about 33, about 34, about 35, about 36, about 37, about 38, about 39, about 40, about 41, about 42, about 43, about 44, about 45, about 46, about 47, about 48, about 49, or about 50, as long as flow rate$_1$ < flow rate$_2$.

A flow rate of the one or more nitrogen-containing species into the processing volume can be about 100 sccm or less for a 300 mm-sized substrate, such as from about 0.1 sccm to about 250 sccm, such as from about 0.2 sccm to about 100 sccm, such as from about 1 sccm to about 50 sccm. In at least one embodiment, the flow rate of the one or more nitrogen-containing species into the processing chamber for a 300 mm-sized substrate ranges from flow rate$_3$ to flow rate$_4$ (in units of sccm), where each of flow rate$_3$ and flow rate$_4$ is independently about 0.1, about 0.2, about 0.5, about 1, about 2, about 3, about 4, about 5, about 6, about 7, about 8, about 9, about 10, about 11, about 12, about 13, about 14, about 15, about 16, about 17, about 18, about 19, about 20, about 21, about 22, about 23, about 24, about 25, about 26, about 27, about 28, about 29, about 30, about 31, about 32, about 33, about 34, about 35, about 36, about 37, about 38, about 39, about 40, about 41, about 42, about 43, about 44, about 45, about 46, about 47, about 48, about 49, or about 50, about 51, about 52, about 53, about 54, about 55, about 56, about 57, about 58, about 59, about 60, about 61, about 62, about 63, about 64, about 65, about 66, about 67, about 68, about 69, about 70, about 71, about 72, about 73, about 74, about 75, about 76, about 77, about 78, about 79, about 80, about 81, about 82, about 83, about 84, about 85, about 86, about 87, about 88, about 89, about 90, about 91, about 92, about 93, about 94, about 95, about 96, about 97, about 98, about 99, or about 100, so long as flow rate$_3$ < flow rate$_4$.

A flow rate ratio of nitrogen-containing species to HF for a 300 mm-sized substrate can be about 0.1 to about 5, such as from about 0.2 to about 2, such as from about 0.5 to about 1.5. In at least one embodiment, the flow rate ratio of nitrogen-containing species to HF for a 300 mm-sized substrate ranges from ratio$_1$ to ratio$_2$ where each of ratio$_1$ and ratio$_2$ is independently about 0.1, about 0.2, about 0.3, about 0.4, about 0.5, about 0.6, about 0.7, about 0.8, about 0.9, about 1.0, about 1.1, about 1.2, about 1.3, about 1.4, about 1.5, about 1.6, about 1.7, about 1.8, about 1.9, about 2.0, about 2.1, about 2.2, about 2.3, about 2.4, about 2.5, about 2.6, about 2.7, about 2.8, about 2.9, about 3.0, about 3.1, about 3.2, about 3.3, about 3.4, about 3.5, about 3.6, about 3.7, about 3.8, about 3.9, about 4.0, about 4.1, about 4.2, about 4.3, about 4.4, about 4.5, about 4.6, about 4.7, about 4.8, about 4.9, or about 5.0, so long as ratio$_1$ < ratio$_2$.

In some embodiments, a mixture of HF and nitrogen-containing species (e.g., HF-pyridine) can be delivered to the process volume through an inlet and a nitrogen containing species can be delivered to the process volume through the same or different inlet. In at least one embodiment, the HF/nitrogen-containing species mixture delivered through a single inlet ranges from mixture$_1$ to mixture$_2$ where each of mixture$_1$ and mixture$_2$ is independently about 10%:90%, about 20%:80%, about 30%:70%, about 40%:60%, about 50%:50%, about 60%:40%, about 70%:30%, about 80%:20%, or about 90%:10%, so long as mixture$_1$ < mixture$_2$.

In some embodiments, a non-reactive process gas, such as a noble gas, such as helium (He), neon (Ne), argon (Ar), krypton (Kr), and/or xenon (Xe), can be used with HF, the nitrogen-containing gas, or both. The non-reactive gas can be used as a carrier gas and/or a purge gas during substrate processing. The non-reactive gas can, e.g., help maintain low water partial pressures during processing which helps mitigate salt formation.

An optional thermal treatment may also be performed between or after the processes associated with box 102 and box 103, and before performing the layer formation process of 104, to remove any residual by-products or contaminants, and to anneal the surface to remove any surface defects. Such a thermal treatment may be performed under, e.g., a hydrogen atmosphere, optionally including a non-reactive gas such as argon and/or helium, and may be performed at temperatures from about 400° C. to about 800° C. and pressures from about 1 Torr to about 300 Torr.

Figure 2A:
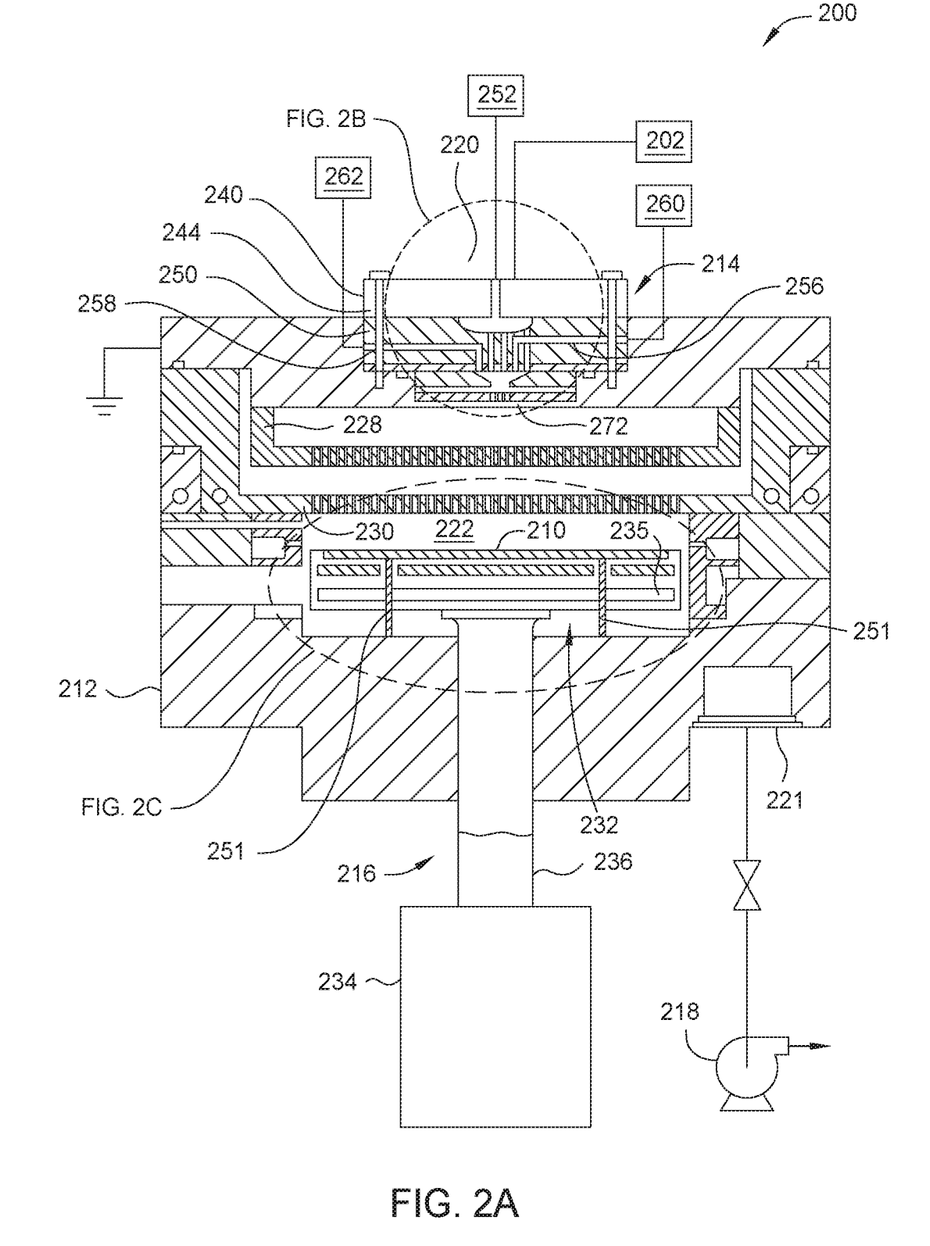
FIG. 2A is a cross-sectional view of an example processing chamber used to perform one or more operations of FIGS. 1A-1B according to at least one embodiment of the present disclosure.
Figure 2B:
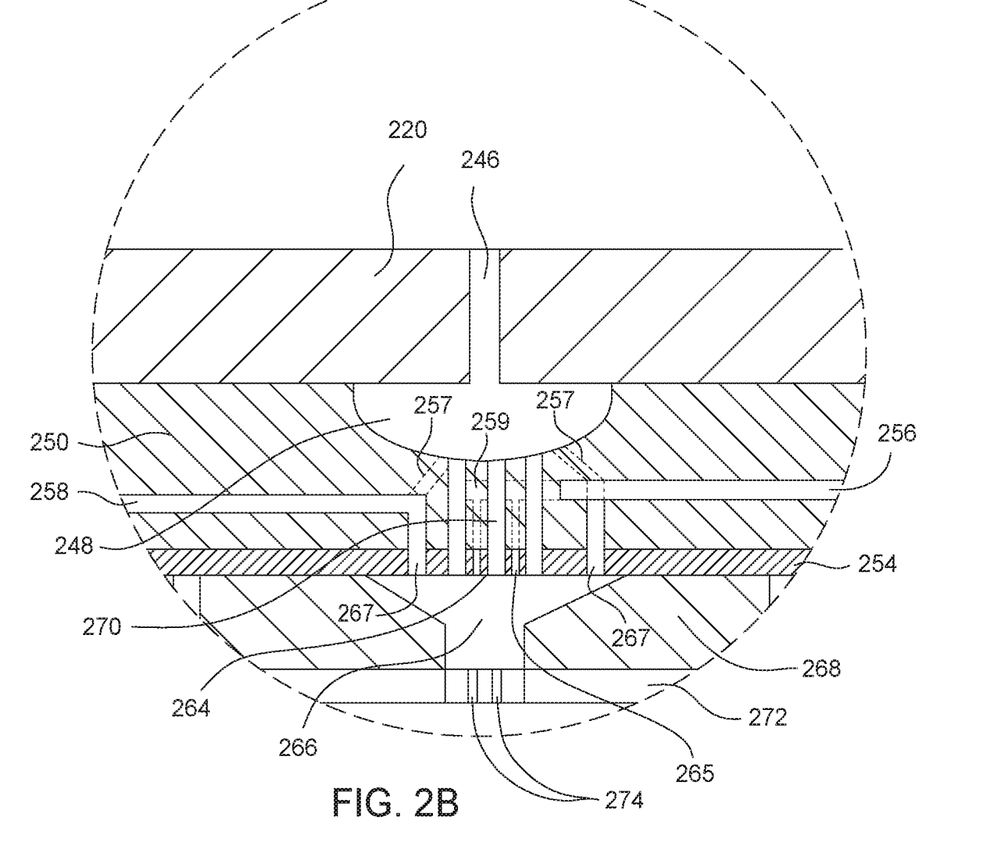
FIG. 2B is an enlarged view of a portion of the processing chamber of FIG. 2A according to at least one embodiment of the present disclosure.

FIG. 2A is a cross-sectional view of an example processing chamber 200 that is adapted to perform at least some of the operations associated with box 102 and process 150 according to at least one embodiment of the present disclosure. The processing chamber 200 is thus configured to remove contaminants, such as oxide, from a surface of a substrate. FIG. 2B is an enlarged view of a portion of the processing chamber 200 of FIG. 2A.

The processing chamber 200 may be particularly useful for performing a dry thermal etch process in vacuum. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from the processing chamber 200. The vacuum system includes a vacuum pump 218 coupled to a vacuum port 221 disposed in the chamber body 212. The processing chamber 200 also includes a controller 202 for controlling processes within the processing chamber 200.

The lid assembly 214 includes a plurality of stacked components configured to provide precursor gases to a processing volume 222 within the processing chamber 200. A gas source 252 is coupled to the lid assembly 214 via a first plate 220. The gas source 252 can be configured to provide a non-reactive gas such as a noble gas. Illustrative, but non-limiting, examples of non-reactive gases include He, Ne, Ar, Kr, and/or Xe, or other non-reactive gas(es).

Referring to FIG. 2B, an opening 246 allows gas(es) to flow from the gas source 252 to a volume 248 formed in a second plate 250 of the lid assembly 214. A central conduit 270, which is formed in the second plate 250, is adapted to provide the gases from the volume 248 through a third plate 254 to a mixing chamber 266 formed in a fourth plate 268 of the lid assembly 214. The central conduit 270 communicates with the mixing chamber 266 through an opening 264 in the third plate 254. The opening 264 may have a diameter less than, greater than or the same as a diameter of the central conduit 270. In the embodiment of FIG. 2B, the opening 264 has diameter the same, or substantially the same, as the central conduit 270.

The second plate 250 also includes a plurality of inlets 256 and 258 that are configured to provide gases to the mixing chamber 266. The inlet 256 is coupled to a first gas source 260 and the inlet 258 is coupled to a second gas source 262. The first gas source 260 and the second gas source 262 may contain process gases as well as non-reactive gases, for example noble gases such as argon and/or helium, utilized as a carrier gas. The first gas source 260 may contain a nitrogen-containing species (e.g., pyridine). The second gas source 262 may contain fluorine-containing gases as well as hydrogen containing gases. In one example, the second gas source 262 may contain hydrogen fluoride (HF). The first gas source 260 and/or the second gas source 262 can contain one or more non-reactive gases.

The first gas source 260 and/or the second gas source 262 may include one or more ampoules, one or more bubblers, and/or one or more liquid vaporizers configured to provide a process gas. For example, in cases where a liquid precursor (e.g., pyridine and/or a mixture of HF/pyridine) is used, the first gas source 260 and/or the second gas source 262 may include a liquid vaporizer in fluid communication with a liquid precursor source (not shown). The liquid vaporizer can be used for vaporizing liquid precursors to be delivered to the lid assembly 214. While not shown, it is contemplated that the liquid precursor source may include, e.g., one or more ampoules of precursor liquid and solvent liquid, a shut-off valve, and a liquid flow meter (LFM). As an alternative to the liquid vaporizer, a bubbler may be used to deliver the liquid precursor(s) to the chamber. In such cases, an ampoule of liquid precursor is connected to the process volume of the chamber through a bubbler.

As illustrated in FIG. 2B, in some configurations, the inlet 256 is coupled to the mixing chamber 266 through a cylindrical channel 259 (shown in phantom) and a plurality of holes 265 formed in the third plate 254. The inlet 258 is coupled to the mixing chamber 266 through a cylindrical channel 257 (shown in phantom) and a plurality of holes 267 formed in the third plate 254. The holes 265, 267 formed in the third plate 254 are generally sized so that they enable a uniform flow of gases, which are provided from their respective gas source 260, 262, into the mixing chamber 266. In one configuration, the holes 267 have a diameter that is less than a width of the opening defined by the opposing sidewalls of the cylindrical channel 257 formed in second plate 250. The holes 267 are typically distributed around the circumference of the center-line of the cylindrical channel 257 to provide uniform fluid flow into the mixing chamber 266. In one configuration, the holes 265 have a diameter that is less than a width of the opening defined by the opposing sidewalls of the cylindrical channel 259 formed in the second plate 250. The holes 265 are typically distributed around the circumference of the center-line of the cylindrical channel 259 to provide uniform fluid flow into the mixing chamber 266.

The inlets 256 and 258 provide respective fluid flow paths laterally through the second plate 250, turning toward and penetrating through the third plate 254 to the mixing chamber 266. The lid assembly 214 also includes a fifth plate or first gas distributor 272, which may be a gas distribution plate, such as a showerhead, where the various gases mixed in the lid assembly 214 are flowed through perforations 274 formed therein. The perforations 274 are in fluid communication with the mixing chamber 266 to provide flow pathways from the mixing chamber 266 through the first gas distributor 272. Referring back to FIG. 2A, a blocker plate 228 and a gas distribution plate, such as a second gas distributor 230, which may be a gas distribution plate, such as a showerhead, is disposed below the lid assembly 214.

The support assembly 216 may include a substrate support 232 to support a substrate 210 thereon during processing. The substrate support 232 may be coupled to an actuator 234 by a shaft 236 which extends through a centrally-located opening formed in a bottom of the chamber body 212. The actuator 234 may be flexibly sealed to the chamber body 212 by bellows (not shown) that prevent vacuum leakage around the shaft 236. The actuator 234 allows the substrate support 232 to be moved vertically within the chamber body 212 between a processing position and a loading position. The loading position is slightly below the opening of a tunnel (not shown) formed in a sidewall of the chamber body 212.

The substrate support 232 has a flat, or a substantially flat, substrate supporting surface for supporting a substrate to be processed thereon. The substrate support 232 may be moved vertically within the chamber body 212 by actuator 234, which is coupled to the substrate support 232 by shaft 236. For some operations, the substrate support 232 may be elevated to a position in close proximity to the lid assembly 214 to control the temperature of the substrate 210 being processed. As such, the substrate 210 may be heated via radiation emitted from the second gas distributor 230, or another radiant source, or by convection or conduction from the second gas distributor 230 through an intervening gas. In some process steps, the substrate may be disposed on lift pins 251 to perform additional thermal processing steps, such as performing an annealing step.

Figure 2C:
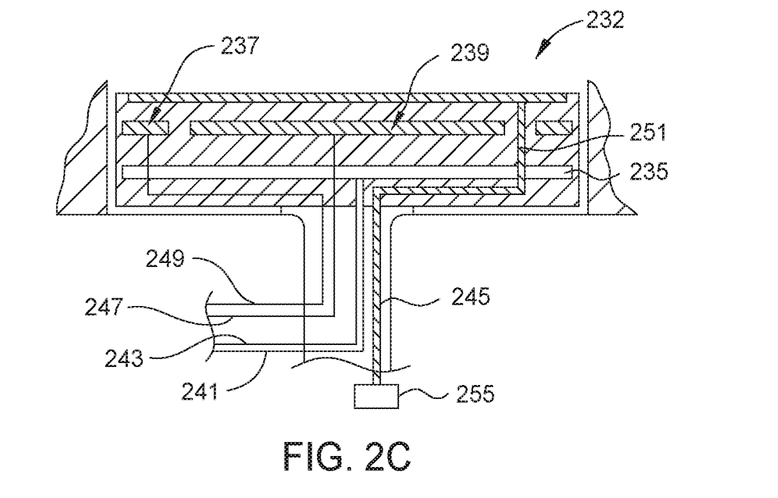
FIG. 2C is an enlarged cross-sectional view of an example substrate support according to at least one embodiment of the present disclosure.

FIG. 2C is an enlarged cross-sectional view of the substrate support 232 of FIG. 2A. The substrate support 232 includes a thermal control plenum 235 in fluid communication with a fluid supply conduit 241 and a fluid return conduit 243. Each of the fluid supply conduit 241 and the fluid return conduit 243 is disposed through the shaft 236. The thermal control plenum 235 may be a cooling feature for the substrate support 232 by circulating a cooling fluid through the fluid supply conduit 241, into the thermal control plenum 235, and out through the fluid return conduit 243.

The substrate support 232 may also include a plurality of heaters. The plurality of heaters, in this embodiment, includes a first heater 237 and a second heater 239. The first heater 237 and the second heater 239 are disposed in a substantially coplanar relationship within the substrate support 232 at a location to enable thermal coupling between the heaters and the substrate supporting surface. The first heater 237 is disposed at a periphery of the substrate support 232, and the second heater 239 is disposed in a central area of the substrate support 232, to provide zonal temperature control. Each of the first heater 237 and the second heater 239 may be a resistive heater that is coupled to one or more power sources (not shown) by respective power conduits 249 and 247, each disposed through the shaft 236.

In operation, temperature control may be provided by concurrent operation of the thermal control plenum 235, the first heater 237, and the second heater 239. The thermal control plenum 235 may be supplied with a cooling fluid, as described above, and power may be provided to the first heater 237 and the second heater 239, as resistive heaters. In this way, separate control circuits may be tuned to provide fast response for one item, for example the first heater 237 and the second heater 239, and slower response for the thermal control plenum 235, or vice versa. At a minimum, different control parameters may be applied to the thermal control plenum 235, the first heater 237, and the second heater 239 to accomplish an optimized, zonal temperature control system.

As shown in FIG. 2C, a separate lift member 245 may be included in the support assembly 216. A recess may be provided in the substrate supporting surface to accommodate the lift pins 251 of the member 245 when the substrate rests on the substrate supporting surface. The lift member 245 may be coupled to a lift actuator 255 by an extension of the lift member 245 disposed through the shaft 236. The lift actuator may move the lift member 245 vertically to lift the substrate off the substrate supporting surface toward the first gas distributor 272. The lift member 245 may be a hoop, such as an open hoop or a closed hoop, which may be U-shaped, circular, horseshoe-shaped, or any convenient shape. The lift member 245 has a thickness to provide structural strength when lifting a substrate. In one example, the lift member is made of a ceramic material and is about 1 mm thick.

The following illustrative, but non-limiting, examples are not intended to limit the scope of embodiments of the present disclosure.

EXAMPLES

The oxide removal process illustrated by example process 150 of FIG. 1B and box 102 of FIG. 1A can be performed in the processing chamber 200 of FIG. 2A. A substrate is positioned in the processing volume 222 by positioning the substrate on the substrate support 232. Pyridine is routed through the inlet 256 from the first gas source 260, and HF is routed through the inlet 258 from the second gas source 262. HF is flown through the inlet 258 at about 2-20 sccm and pyridine is flown through the inlet 256 at a flow rate of about 0.2×-2× the flow rate of HF. During etching, the substrate is maintained at a temperature from about −10° C. to about 15° C., with or without $(C_5H_5N)_2SiF_4$ complex formation. The substrate is maintained at this temperature by, e.g., routing a temperature control fluid through the thermal control plenum 235. The substrate support 232 may be powered to provide radial temperature control. The chamber is maintained at a pressure of about 600 Torr or less, and the substrate is processed for a time suitable for converting all desired oxide(s) on the substrate surface into volatile $SiF_4$ or its amine complex, for example 100 seconds. If an anneal is desired, the annealing temperature can be about 80° C. or less.

In some embodiments, existing chambers for etching/cleaning can be retrofitted. For example, $NH_3$, water, and/or alcohol lines can be replaced with pyridine lines in chambers that use HF, such as Clarion™ chambers. Pyridine, which can be anhydrous, can be delivered using a bubbler, and HF, which can be anhydrous, can be delivered via facility gas line or as a HF-pyridine mixture (e.g., HF ~70%, pyridine ~30%) in a bubbler.

The methods described herein enable removal of undesired oxide on one or more surfaces of high aspect ratio device features. The methods described herein are salt-free, highly selective, and enable high-throughput cleaning of high aspect ratio features with minimal loss of dielectric materials. In addition, the methods described herein enable isotropic and conformal cleaning of features. Compared to the state-of the-art methods, the methods described herein minimize HF corrosion and carbon contamination, all while avoiding selectivity reductions and the salt pinch-off problems during native oxide clean at the bottom of high aspect ratio structures.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
introducing a substrate to a processing volume of a processing chamber by positioning the substrate on a substrate support;
flowing a first process gas into the processing volume, the first process gas comprising HF;
flowing a second process gas into the processing volume, the second process gas comprising pyridine, pyrrole, aniline, or a combination thereof; and
exposing the substrate to the first process gas and the second process gas to remove oxide from the substrate under oxide removal conditions.

2. The method of claim 1, wherein the first process gas and the second process gas are co-flown into the processing volume.

3. The method of claim 1, wherein the second process gas is intermittently flown into the processing volume while the first process gas is flown into the processing volume.

4. The method of claim 1, further comprising forming a film on the substrate by a vapor phase epitaxy process.

5. The method of claim 1, further comprising cooling the substrate while removing oxide from the substrate.

6. The method of claim 1, further comprising heating the substrate to a temperature of about 50° C. to about 80° C. after or between exposures to the process gases.

7. The method of claim 1, further comprising performing a thermal treatment process on the substrate after removing at least a portion of oxide from the substrate, the thermal treatment process comprising:
flowing an inert gas into the processing chamber; and
maintaining the substrate at a temperature of about 400° C. or more.

8. The method of claim 1, wherein the oxide removal conditions comprise:
maintaining the substrate at a temperature from about −10° C. to about 80° C.;
maintaining the processing volume at a pressure of about 600 Torr or less; or
a combination thereof.

9. The method of claim 1, wherein the oxide removal conditions comprise:
maintaining the substrate at a temperature from about 0° C. to about 60° C.;
maintaining the processing volume at a pressure of about 10 Torr or less; or
a combination thereof.

10. The method of claim 1, wherein:
a flow rate of the first process gas into the processing volume is about 1 sccm to about 50 sccm for a 300 mm-sized substrate;
a flow rate ratio of the second process gas to the first process gas is about 0.1 to about 5; or
a combination thereof.

11. The method of claim 1, wherein:
a flow rate of the first process gas into the processing volume is about 2 sccm to about 20 sccm for a 300 mm-sized substrate;
a flow rate ratio of the second process gas to the first process gas is about 0.2 to about 2; or
a combination thereof.

12. A system, comprising:
a processing chamber to process a substrate; and
a controller to cause a processing method to be performed in the processing chamber, the processing method comprising:
introducing a substrate to a processing volume of the processing chamber by positioning the substrate on a substrate support;
flowing a first process gas into the processing volume, the first process gas comprising HF;
flowing a second process gas into the processing volume, the second process gas comprising pyridine, pyrrole, aniline, or a combination thereof; and
exposing the substrate to the first process gas and the second process gas to remove oxide from the substrate under oxide removal conditions.

13. The system of claim 12, wherein the oxide removal conditions comprise:
maintaining the substrate at a temperature from about −10° C. to about 80° C.;
maintaining the processing volume at a pressure of about 600 Torr or less; or
a combination thereof.

14. The system of claim 12, wherein the oxide removal conditions comprise:
maintaining the substrate at a temperature from about 0° C. to about 60° C.;
maintaining the processing volume at a pressure of about 10 Torr or less; or
a combination thereof.

15. The system of claim 12, wherein:
a flow rate of the first process gas into the processing volume is about 1 sccm to about 50 sccm for a 300 mm-sized substrate;
a flow rate ratio of the second process gas to the first process gas is about 0.1 to about 5; or
a combination thereof.

16. The system of claim 12, wherein:
a flow rate of the first process gas into the processing volume is about 2 sccm to about 20 sccm for a 300 mm-sized substrate;
a flow rate ratio of the second process gas to the first process gas is about 0.2 to about 2; or
a combination thereof.

17. The system of claim 12, further comprising heating the substrate to a temperature of about 50° C. to about 80° C. after or between exposures to the process gases.

18. A system, comprising:
a processing chamber to process a substrate; and
a controller to cause a processing method to be performed in the processing chamber, the processing method comprising:
introducing a substrate to a processing volume of the processing chamber by positioning the substrate on a substrate support;
flowing a first process gas into the processing volume, the first process gas comprising HF;
flowing a second process gas into the processing volume, the second process gas comprising pyridine, pyrrole, aniline, or a combination thereof; and
exposing the substrate to the first process gas and the second process gas to remove oxide from the substrate under oxide removal conditions, the oxide removal conditions comprising:
maintaining the substrate at a temperature from about −10° C. to about 80° C.;
maintaining the processing volume at a pressure of about 600 Torr or less; or
a combination thereof.

19. The system of claim 18, wherein the oxide removal conditions comprise:
- maintaining the substrate at a temperature from about 0° C. to about 60° C.;
- maintaining the processing volume at a pressure of about 10 Torr or less;
- a flow rate of the first process gas into the processing volume is about 2 sccm to about 20 sccm for a 300 mm-sized substrate;
- a flow rate ratio of the second process gas to the first process gas of about 0.1 to about 5; or
- a combination thereof.

20. The system of claim 19, wherein the flow rate ratio of the second process gas to the first process gas is about 0.2 to about 2.

* * * * *